US010111302B2

(12) United States Patent
Hou

(10) Patent No.: US 10,111,302 B2
(45) Date of Patent: Oct. 23, 2018

(54) COMPATIBLE INDUCTOR-TYPE CIRCUIT STRUCTURE WITH DIRECT INPUT FROM COMMERCIAL POWER

(71) Applicant: Chih-Yung Hou, Kaohsiung (TW)

(72) Inventor: Chih-Yung Hou, Kaohsiung (TW)

( * ) Notice: Subject to any disclaimer, the term of this patent is extended or adjusted under 35 U.S.C. 154(b) by 0 days.

(21) Appl. No.: 15/700,471

(22) Filed: Sep. 11, 2017

(65) Prior Publication Data

US 2018/0077774 A1 Mar. 15, 2018

(30) Foreign Application Priority Data

Sep. 14, 2016 (TW) .............................. 105214234 U

(51) Int. Cl.
| | |
|---|---|
| *H05B 37/00* | (2006.01) |
| *H05B 37/02* | (2006.01) |
| *F21V 23/00* | (2015.01) |
| *G06F 17/50* | (2006.01) |

(52) U.S. Cl.
CPC ........... *H05B 37/02* (2013.01); *F21V 23/005* (2013.01); *G06F 17/5009* (2013.01)

(58) Field of Classification Search
CPC .... H05B 37/02; F21V 23/005; G06F 17/5009
USPC ........................................................ 315/123
See application file for complete search history.

(56) References Cited

U.S. PATENT DOCUMENTS

| | | | | |
|---|---|---|---|---|
| 9,756,698 | B2 * | 9/2017 | Xiong | ............... H05B 33/0887 |
| 9,775,215 | B2 * | 9/2017 | Xiong | ............... H05B 33/0887 |
| 2017/0094746 | A1 * | 3/2017 | Xiong | ............... H05B 33/0887 |

* cited by examiner

Primary Examiner — Daniel D Chang
(74) Attorney, Agent, or Firm — Che-Yang Chen; Law Offices of Scott Warmuth

(57) ABSTRACT

A compatible inductor-type circuit structure with direct input from commercial power includes a substrate and a light-source control-loop device. The light-source control-loop device is disposed on the substrate and includes a constant current circuit, plural light source modules, a switch, a commercial power simulation circuit, a high voltage protection circuit, plural bridge rectifier circuits and a limited current protection circuit. The constant current circuit, the light source modules, the switch, the commercial power simulation circuit, the high voltage protection circuit, the bridge rectifier circuits and the limited current protection circuit are connected together electrically. By the above-mentioned structures, a luminaire can be installed directly on any lamp holder, without considering whether to remove the ballast. The circuit structure can be compatible with a dedicated LED lamp holder or a lamp holder activated by a ballast, thereby facilitating the usage.

7 Claims, 3 Drawing Sheets

COMPATIBLE INDUCTOR-TYPE CIRCUIT STRUCTURE WITH DIRECT INPUT FROM COMMERCIAL POWER

BACKGROUND OF THE INVENTION a) Field of the Invention

The present invention relates to a compatible inductor-type circuit structure with direct input from commercial power, and more particularly to a circuit structure that is compatible with a dedicated LED (Light Emitting Diode) lamp holder or that is activated by a ballast.

b) Description of the Prior Art

For a conventional fluorescent tube, a regenerative feedback relationship exists between the discharge current and the on-resistance of the tube. As the increase in the current entering the fluorescent tube, more and more gas is ionized that the on-resistance in the fluorescent tube will decrease continuously. Accordingly, more and more current will enter the fluorescent tube, and if the fluorescent tube is connected directly to a power source with a predetermined voltage, the fluorescent tube will be burned out quickly as the current increases continuously. Therefore, an auxiliary circuit is required to control the current entering the fluorescent tube at a predetermined level, and this current control circuit is usually called a ballast. In fact, the ballast is an inductor that is connected serially with the fluorescent tube. When the current in the fluorescent tube increases, the voltage in the ballast will increase as well, and the voltage in the fluorescent tube can be reduced. Thus, the current in the fluorescent tube will be further reduced, and the current in the fluorescent tube can be prevented from changing rapidly. However, by this repetitive action, when the on-resistance decreases to a very low level, the breakover current will approach to a fixed value by the ballast, and the fluorescent tube can be operated stably. Therefore, it can be seen that the conventional fluorescent tube is not a dedicated negative light source with an operating voltage of 110V or 220V, but a light source using the ballast to adjust the operating voltage that is actually inputted to the fluorescent tube, thereby preventing the fluorescent tube from being damaged immediately.

For the abovementioned fluorescent tube, through the collaboration of the ballast with a starter, the transient high voltage that ionizes the gas will enable the filament voltage to reach a level that the fluorescent tube can discharge. On the other hand, as a modern electronic ballast already includes the starting function, the starter is not needed anymore. When an LED lamp tube is used in a conventional luminaire, as the operating current thereof is fixed, the conventional ballast will not change the input voltage due to the change in the current. Therefore, the LED lamp tube will not be affected. However, as the starter and the electronic ballast are required to result in gas discharge, the starting voltage will increase, which may damage the LED lamp tube as the transient voltage is too high. Accordingly, before installing an LED lamp tube to a conventional fluorescent lamp, the starter and the electronic ballast have to be removed, which may cause the following issues:

1. Inconvenience: the installation of the LED florescent lamp tube may need a professional worker because the ballast and the starter on the original lamp holder should be removed first so that the conventional lamp can be changed into the LED lamp tube, which may increase the construction cost and causes the inconvenience in use.
2. The cost of assembly is high: the assembly and manufacturing procedures of an LED fluorescent tube are tedious, which may increase the production cost.

SUMMARY OF THE INVENTION

The object of the present invention is to provide a circuit structure that is compatible with a dedicated LED lamp holder or that is activated by a ballast. This kind of circuit structure can be directly compatible with a dedicated LED lamp holder or a lamp holder activated by a ballast, without requiring an additional implementation work or identification of the type of the lamp holder, so as to facilitate the usage.

To achieve the abovementioned object, the present invention discloses a compatible inductor-type circuit structure with direct input from commercial power, including a substrate and a light-source control-loop device. The light-source control-loop device is installed on the substrate and is provided with a constant current circuit, plural light source modules, a switch, a commercial power simulation circuit, a high voltage protection circuit, plural bridge rectifier circuits, and a limited current protection circuit. The constant current circuit, the light source modules, the switch, the commercial power simulation circuit, the high voltage protection circuit, the bridge rectifier circuits and the limited current protection circuit are connected together electrically, whereas the light-source control-loop device is disposed on the substrate and is connected electrically with conductive sections disposed on end sides of the substrate.

In an embodiment of the present invention, the substrate is provided with a surface portion and two end sides. The light-source control-loop device is disposed on the surface portion and each end side of the substrate is provided respectively with a positive and negative conductive section. In addition, the light-source control-loop device is connected electrically with the positive and negative conductive sections.

In an embodiment of the present invention, the bridge rectifier circuits is configured to convert the AC (Alternating Current) current outputted from the ballast into the DC (Direct Current) current to provide electricity to the light source modules.

In an embodiment of the present invention, after the required electricity is inputted to the limited current protection circuit, a different potential waveform is outputted, and is then inputted to the commercial power simulation circuit and the high voltage protection circuit.

In an embodiment of the present invention, when detecting that the potential waveform signal belongs to the AC current input, the commercial power simulation circuit will limit the operation of the high voltage protection circuit, and limit the switch from being turned-off, allowing the constant current circuit to operate so that the entire circuit structure is compatible with the AC input.

In an embodiment of the present invention, when detecting that the potential waveform signal at the transient high voltage input of the ballast, the commercial power simulation circuit will limit the high voltage protection circuit from operating and control the switch to work, absorbing high voltage energy from the activation of the ballast and enlightening the light source modules.

In an embodiment of the present invention, when detecting that the potential waveform signal at a normal output of the ballast, the commercial power simulation circuit will not limit the high voltage protection circuit from operating and release the control of the switch to the high voltage protection circuit. The high voltage protection circuit then checks a first voltage section and a second voltage section on the entire circuit through the limited current protection circuit, and forms a digital voltage signal. Based upon the digital voltage signal, the high voltage protection circuit controls the switch and the current that flows through the light source modules. In addition, the high voltage protection circuit prevents the first voltage section from higher than the starting voltage of the flywheel module in the constant current circuit, allowing the flywheel module to be idle.

In an embodiment of the present invention, a first joint is disposed between the substrate and the light-source control-loop device and is connected with a second joint.

In an embodiment of the present invention, the first joint is disposed on a side face of the substrate and is provided at least with a first end and a second end. The first end is connected to the positive and negative conductive sections, and the second end is connected to the light-source control-loop device.

In an embodiment of the present invention, the second joint is provided at least with a first slot corresponding to the first end and a second slot corresponding to the second end. The first slot and the second slot are interconnected.

By the abovementioned technical means, the entire circuit structure is directly compatible with any type of the lamp holder, without requiring additional identification and implementation to the lamp holder. In addition, the present invention can be compatible with a dedicated LED lamp holder or a lamp holder activated by a ballast, thereby facilitating the usage.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
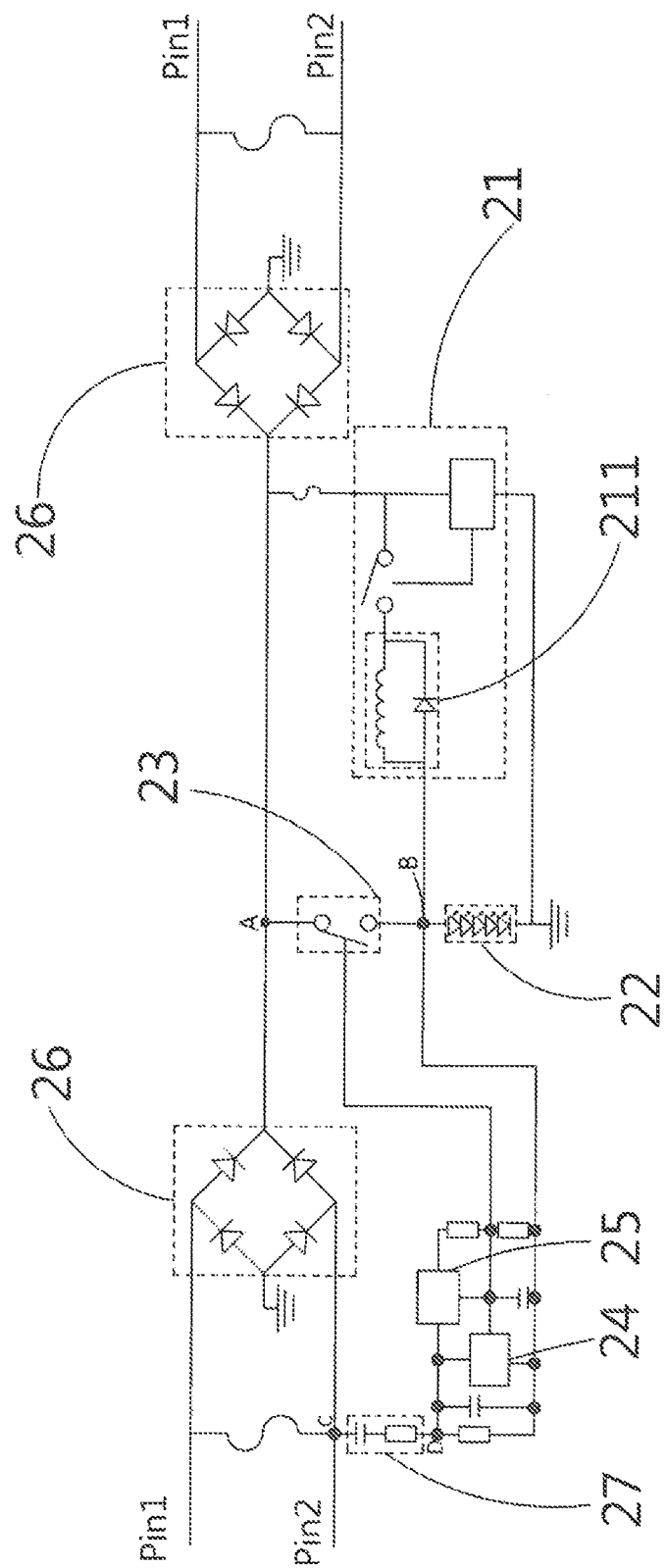
FIG. 1 shows a circuit diagram of the present invention.

In the following embodiment, same or similar reference numerals are used to designate the same or similar elements. In addition, the direction of the language referred to in the following embodiment, for example: up, down, left, right, front or rear, etc., is only with reference to the accompanying drawings of direction. Therefore, the direction of the use of terminology is used to describe, not intended to limit, the present invention.

Referring to FIG. 1, it shows a circuit diagram of the present invention, wherein the specific circuit designs can be seen clearly. Each component (circuit) is described hereinafter.

The constant current circuit 21 is used to provide a stable operating current to the light source modules 22. The constant current circuit 21 starts operating and operates when the first voltage section (UAB, the voltage drop between point A and point B) is higher than 80V.

The light source modules 22 are LED lamps that provide light.

The switch 23 is the element that controls the light source modules 22, and is connected with the commercial power simulation circuit 24 and the high voltage protection circuit 25.

Depending upon the potential waveform signal inputted to the limited current protection circuit 27, the commercial power simulation circuit 24 and the high voltage protection circuit 25 are described hereinafter in three conditions.

When the potential waveform signal outputted to the commercial power simulation circuit 24 from the limited current protection circuit 27 at the AC current input, the commercial power simulation circuit 24 will limit the operation of the high voltage protection circuit 27 and limit the switch 23 from being turned-off, allowing the constant current circuit 21 to operate, so that the entire circuit structure can be compatible with the AC current input.

When the potential waveform signal outputted to the commercial power simulation circuit 24 from the limited current protection circuit 27 at the transient high voltage input of the ballast, the commercial power simulation circuit 24 will limit the operation of the high voltage protection circuit 25 and control the operation of the switch 23, absorbing high voltage energy from the activation of the ballast and enlightening the light source modules 22.

When the potential waveform signal outputted to the commercial power simulation circuit 24 from the limited current protection circuit 27 at a normal output of the ballast, the commercial power simulation circuit 24 will not limit the high voltage protection circuit 25 from operating and release the control to the switch 23 of the high voltage protection circuit 25. The high voltage protection circuit 25 then checks the first voltage section (UAB) and the second voltage section (UCA, the voltage drop between point C and point A) on the entire circuit through the limited current protection circuit 27, and forms a digital voltage signal. Based upon the digital voltage signal (the digital voltage signal formed by the first voltage section (UAB) and the second voltage section (UCA)), the high voltage protection circuit 25 controls the switch 23 and the current that flows through the light source modules 22. In addition, the high voltage protection circuit 25 will limit the first voltage section (UAB) from higher than the starting voltage of the flywheel module (SW) in the constant current circuit 21, allowing the flywheel module to be idle.

The bridge rectifier circuits 26 is configured to convert electricity inputted from outside into the DC current.

The limited current protection circuit 27 is basically a band-pass circuit, and under a different input frequency, the waveform thereof will have a different impedance. The limited current protection circuit 27 is used primarily to detect the various features of the power input for a light source (LED) and provide the possibility in different control to the subsequent control circuit.

Figure 2:
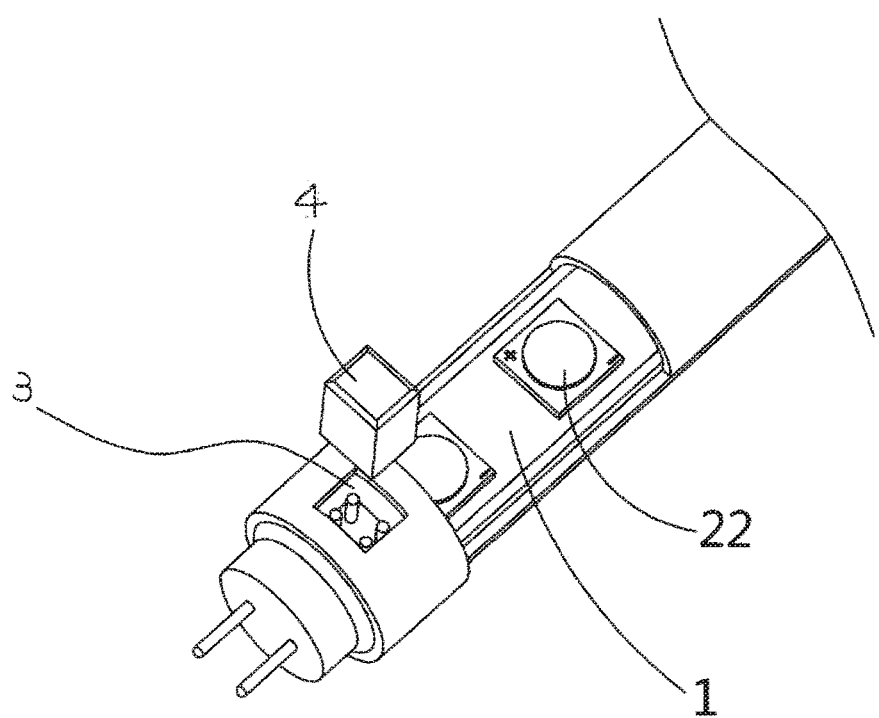
FIG. 2 shows an exploded view of a light board and a luminaire of the present invention.
Figure 3:
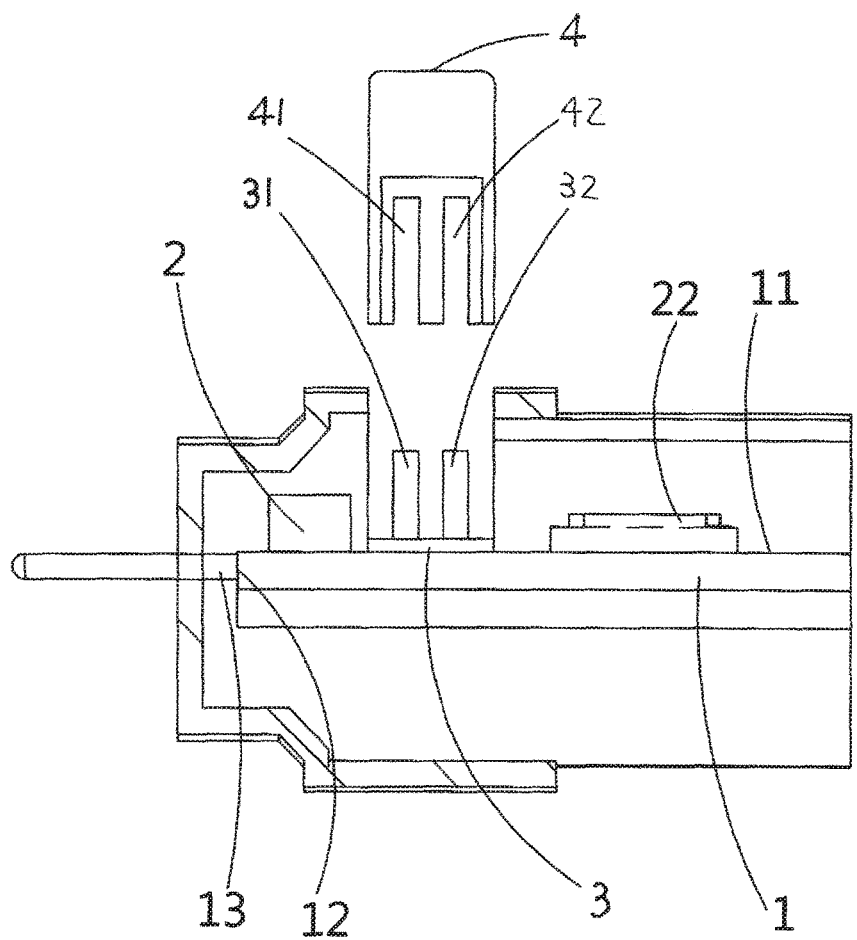
FIG. 3 shows a cutaway view of the light board and the luminaire of present invention.

Referring to FIG. 2 and FIG. 3, it shows an exploded view and a cutaway view of a light board and a luminaire of the present invention. In these two drawings, the emphasis is on the first joint 3 and the second joint 4 with a safety function. If the first end 31 and the second end 32 in the first joint 3 are not interconnected, the first slot 41 and the second slot 42 in the second joint 4 will form a path. Therefore, when the first joint 3 is engaged with the second joint 4, the entire structure will constitute a complete loop. More specifically, this kind of structure is used to assure that there will be no electric shock by touching the electrodes accidentally in installation.

The surface portion 11 on the substrate 1 provides for the provision of major elements, including primarily the light-source control-loop device 2. The two end sides 12 of the substrate 1 are provided respectively with a positive and negative conductive section 13 used to connect with a lamp holder. This is a lamp tube like structure, and when the circuit technology disclosed by the present invention is applied to other type of luminaire, the object will be replaced equivalently.

The present invention provides a compatible ballast circuit design. In addition to being applied to the lamp tube in the drawings, the structure can be further applied to any luminaire using the ballast. As the details are too overwhelming, no further description is provided.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A compatible inductor-type circuit structure with direct input from commercial power, comprising:
    a substrate; and
    a light-source control-loop device, which is disposed on the substrate and includes a constant current circuit, plural light source modules, a switch, a commercial power simulation circuit, a high voltage protection circuit, plural bridge rectifier circuits, and a limited current protection circuit;
    wherein the constant current circuit, the light source modules, the switch, the commercial power simulation circuit, the high voltage protection circuit, the bridge rectifier circuits and the limited current protection circuit are connected together electrically, whereas the light-source control-loop device is disposed on the substrate and is connected electrically with conductive sections disposed on two end sides of the substrate,
    wherein the bridge rectifier circuits convert an AC current into a DC current to provide electricity to the light source modules, and
    wherein after the required electricity is inputted to the limited current protection circuit, a potential waveform signal is outputted, and is then inputted to the commercial power simulation circuit and the high voltage protection circuit.

2. The compatible inductor-type circuit structure with direct input from commercial power, according to claim 1, wherein the substrate is provided with a surface portion and the two end sides, the light-source control-loop device is disposed on the surface portion, each end side of the substrate is provided respectively with a positive and negative conductive section, and the light-source control-loop device is connected electrically with the positive and negative conductive sections.

3. The compatible inductor-type circuit structure with direct input from commercial power, according to claim 2, wherein a first joint is disposed on the surface portion of the substrate and is provided with a first end and a second end, with that the first end is connected to the positive and negative conductive sections, and the second end is connected to the light-source control-loop device.

4. The compatible inductor-type circuit structure with direct input from commercial power, according to claim 3, wherein a second joint is provided with a first slot corresponding to the first end and a second slot corresponding to the second end, with that the first slot and the second slot are interconnected.

5. The compatible inductor-type circuit structure with direct input from commercial power, according to claim 1, wherein upon detecting that the potential waveform signal at an AC current input, the commercial power simulation circuit limits the high voltage protection circuit from operating and limits the switch from being turned-off, allowing the constant current circuit to operate, so that the compatible inductor-type circuit structure is compatible with the AC current input.

6. The compatible inductor-type circuit structure with direct input from commercial power, according to claim 1, wherein upon detecting that the potential waveform signal at a transient high voltage input, the commercial power simulation circuit limits the high voltage protection circuit from operating and controls the switch.

7. The compatible inductor-type circuit structure with direct input from commercial power, according to claim 1, wherein upon detecting that the potential waveform signal at a normal output, the commercial power simulation circuit does not limit the high voltage protection circuit from operating and release the control of the switch to the high voltage protection circuit, the high voltage protection circuit then checks a first voltage section and a second voltage section on the compatible inductor-type circuit through the limited current protection circuit and forms a digital voltage signal; based upon that digital voltage signal, the high voltage protection circuit controls the switch and the current that flows through the light source modules, as well as limits the first voltage section from higher than the starting voltage of the flywheel module in the constant current circuit, enabling the flywheel module to be idle.

* * * * *